(12) United States Patent
Lee et al.

(10) Patent No.: US 12,363,844 B2
(45) Date of Patent: Jul. 15, 2025

(54) DISPLAY MODULE AND DISPLAY DEVICE (71) Applicant: LG Display Co., Ltd., Seoul (KR)

(72) Inventors: Junjae Lee, Paju-si (KR); Myeongah Shin, Seoul (KR)

(73) Assignee: LG Display Co., Ltd., Seoul (KR)

( * ) Notice: Subject to any disclaimer, the term of this patent is extended or adjusted under 35 U.S.C. 154(b) by 359 days.

(21) Appl. No.: 17/980,710

(22) Filed: Nov. 4, 2022

(65) Prior Publication Data
US 2023/0209754 A1 Jun. 29, 2023

(30) Foreign Application Priority Data

Dec. 27, 2021 (KR) ........................ 10-2021-0188219

(51) Int. Cl.
| | | |
|---|---|---|
| *H05K 5/03* | (2006.01) |
| *B32B 3/30* | (2006.01) |
| *B32B 5/18* | (2006.01) |
| *B32B 7/12* | (2006.01) |
| *B32B 15/08* | (2006.01) |
| *B32B 15/18* | (2006.01) |
| *B32B 15/20* | (2006.01) |
| *B32B 27/06* | (2006.01) |
| *B32B 27/08* | (2006.01) |

(Continued)

(52) U.S. Cl.
CPC ................. *H05K 5/03* (2013.01); *B32B 3/30* (2013.01); *B32B 5/18* (2013.01); *B32B 7/12* (2013.01); *B32B 15/08* (2013.01); *B32B 15/18* (2013.01); *B32B 15/20* (2013.01); *B32B 27/065* (2013.01); *B32B 27/08* (2013.01); *B32B 27/281* (2013.01); *B32B 27/36* (2013.01); *H05K 7/20963* (2013.01); *B32B 2307/30* (2013.01); *B32B 2307/42* (2013.01); *B32B 2457/20* (2013.01); *H10K 59/12* (2023.02)

(58) Field of Classification Search
CPC ...... H05K 5/0017; H05K 5/0217; H05K 5/03; H05K 1/028; H05K 1/0281; G06F 1/1652; G06F 1/1626
See application file for complete search history.

(56) References Cited

U.S. PATENT DOCUMENTS 11,581,516 B2  2/2023  Choi et al.
11,799,997 B2  10/2023  Kim et al.
(Continued)

FOREIGN PATENT DOCUMENTS

KR  10-2020-0074700 A  6/2020
KR  10-2021-0049326 A  5/2021
(Continued)

OTHER PUBLICATIONS

Korean Intellectual Property Office, Office Action, Korean Patent Application No. 10-2021-0188219, May 31, 2025, 11 pages.

*Primary Examiner* — Adam B Dravininkas
(74) *Attorney, Agent, or Firm* — Fenwick & West LLP (57) ABSTRACT

A display module and a display device are provided. The display module according to an exemplary embodiment of the present disclosure may include a cover member, a display panel disposed a surface of the cover member, a cushioning plate on a surface of the display panel, and an adhesive layer between the cover member and the display panel. An end portion of the adhesive layer may be positioned more outwardly toward an end of the cover member than an end portion of the display panel.

25 Claims, 6 Drawing Sheets (51) Int. Cl.
    *B32B 27/28*     (2006.01)
    *B32B 27/36*     (2006.01)
    *H05K 7/20*     (2006.01)
    *H10K 59/12*     (2023.01)

(56) References Cited

U.S. PATENT DOCUMENTS

| | | | | |
|---|---|---|---|---|
| 2016/0155788 | A1* | 6/2016 | Kwon | H10K 59/124 |
| | | | | 257/40 |
| 2017/0364123 | A1* | 12/2017 | Seo | G06F 1/1652 |
| 2019/0373719 | A1* | 12/2019 | Lee | H05K 1/0203 |
| 2020/0136066 | A1* | 4/2020 | Jin | H10K 59/131 |
| 2020/0137890 | A1* | 4/2020 | Lee | G06F 1/1637 |
| 2020/0194712 | A1* | 6/2020 | Choi | H10K 71/00 |
| 2021/0126223 | A1 | 4/2021 | Choi et al. | |
| 2021/0202460 | A1 | 7/2021 | Shin et al. | |
| 2021/0377376 | A1 | 12/2021 | Kim et al. | |

FOREIGN PATENT DOCUMENTS

| | | |
|---|---|---|
| KR | 10-2021-0083970 A | 7/2021 |
| KR | 10-2021-0148457 A | 12/2021 |

\* cited by examiner

DISPLAY MODULE AND DISPLAY DEVICE

CROSS-REFERENCE TO RELATED APPLICATION

This application claims the benefit of and priority to Republic of Korea Patent Application No. 10-2021-0188219 filed on Dec. 27, 2021, which is hereby incorporated by reference in its entirety.

BACKGROUND

Technical Field

The present disclosure relates to a display module and a display device, and more particularly, to a display module and a display device allowing for a reduction in occurrence of a brightness phenomenon and a greenish phenomenon in an end portion of a display panel.

Discussion of the Related Art

Recently, display devices are implemented in a variety of forms, such as a television, a monitor, a smart phone, a tablet personal computer (PC), a notebook computer, and a wearable device.

In general, a display device includes an active area for displaying a screen and a non-active area formed along an outer portion of the active area.

In the display device, the non-active area is also called a bezel area. If the bezel area is thick, a user's gaze is dispersed, but if the bezel area is thin, the user's gaze is fixed on a screen of the active area, thereby allowing for an increase in immersion.

That is, when the bezel area is thinner, an overall size of the display device can be reduced and the user's immersion can be increased. Therefore, consumer demand for display devices allowing for a maximal decrease in the bezel area is increasing.

SUMMARY

Electric charges may be generated in a surface of a display device by physical friction or the like.

When the generated electric charge is not discharged to the outside through a ground path, the electric charge may be concentratedly accumulated on a side surface of an end portion of a display panel that is positioned in a bezel area of the display panel.

When electric charges are accumulated in a specific area, the electric charges may move to an inside of the display panel. When the electric charges are accumulated in the display panel, an electric field may be formed between the electric charges and a thin film transistor. In particular, a strong electric field may be formed on the side surface of the end portion of the display panel.

When a strong electric field is formed on the side surface of the end portion of the display panel, an element is changed due to polarization of the thin film transistor, so that a phenomenon in which a side area of the end portion is brighter compared to the active area of the display panel and a greenish phenomenon in which a partial area thereof become greenish may occur.

A brightness phenomenon and a greenish phenomenon occur in the end portion of the display panel, which may lead to poor quality of the display panel.

Accordingly, a display module and a display device are disclosed that allow for a reduction in occurrence of a brightness phenomenon and a greenish phenomenon in the end portion of the display panel, an increase in process efficiency, and a reduction in loss of a charging function.

An aspect of the present disclosure is to provide a display module and a display device allowing for a reduction in occurrence of a brightness phenomenon and a greenish phenomenon in an end portion of a display panel.

Another aspect of the present disclosure is to provide a display module and a display device in which an inflow of electric charges in a cover member into a display panel is reduced and a majority of the electric charges can be effectively discharged to the outside.

Objects of the present disclosure are not limited to the above-mentioned objects, and other objects, which are not mentioned above, can be clearly understood by those skilled in the art from the following descriptions.

In order to achieve the aspects as described above, a display module comprises: a cover member including an end portion; a display panel on a surface of the cover member; a cushioning plate on a surface of the display panel; and an adhesive layer between the cover member and the display panel, wherein an end portion of the adhesive layer is positioned more outwardly toward the end portion of the cover member than an end portion of the display panel.

In one embodiment, a display module comprises: a display panel having a first side and a second side opposite the second side; a cover member on the first side of the display panel; and an insulation layer on the first side of the display panel, the insulation layer between the cover member and the display panel, wherein an end of the insulation layer extends past an end of the display panel.

In one embodiment, a display module comprises: a display panel having a first side and a second side opposite the second side; a cover member on the first side of the display panel; an adhesive layer on the first side of the display panel, the adhesive layer between the cover member and the display panel, wherein a distance between an end of the adhesive layer and an end of the cover member is less than a distance between an end of the display panel and the end of the cover member Other detailed matters of the exemplary embodiments are included in the detailed description and the drawings.

According to embodiments of the present disclosure, by disposing an end portion of an adhesive layer positioned between a display panel and a cover member to extend outwardly, it is possible to prevent movements of electric charges in the cover member due to the adhesive layer formed of an insulating material.

Accordingly, it is possible to reduce movements of electric charges to an inside of the display panel, thereby reducing a brightness phenomenon and a greenish phenomenon that may intensively occur in a partial area of a side surface of the display panel.

It should be noted that effects of the present disclosure are not limited to those described above and other effects of the present disclosure will be apparent to those skilled in the art from the following descriptions. The foregoing general description and the following detailed description of the present disclosure are not intended to specify essential limitations recited in the claims. Therefore, the scope of the claims is not restricted by the foregoing general description and the following detailed description of the present disclosure.

DETAILED DESCRIPTION

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When the time sequence between two or more incidents is described using the terms such as "after", "subsequent to", "next to", and "before", two or more incidents may be inconsecutive unless the terms are used with the term "immediately" or "directly".

When an element or layer is disposed "on" another element or layer, it may be directly on another element or layer, or another layer or another element may be interposed therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Same reference numerals generally denote same elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display module and a display device according to an exemplary embodiment of the present disclosure will be described in detail with reference to the accompanying drawings.

Figure 1A:
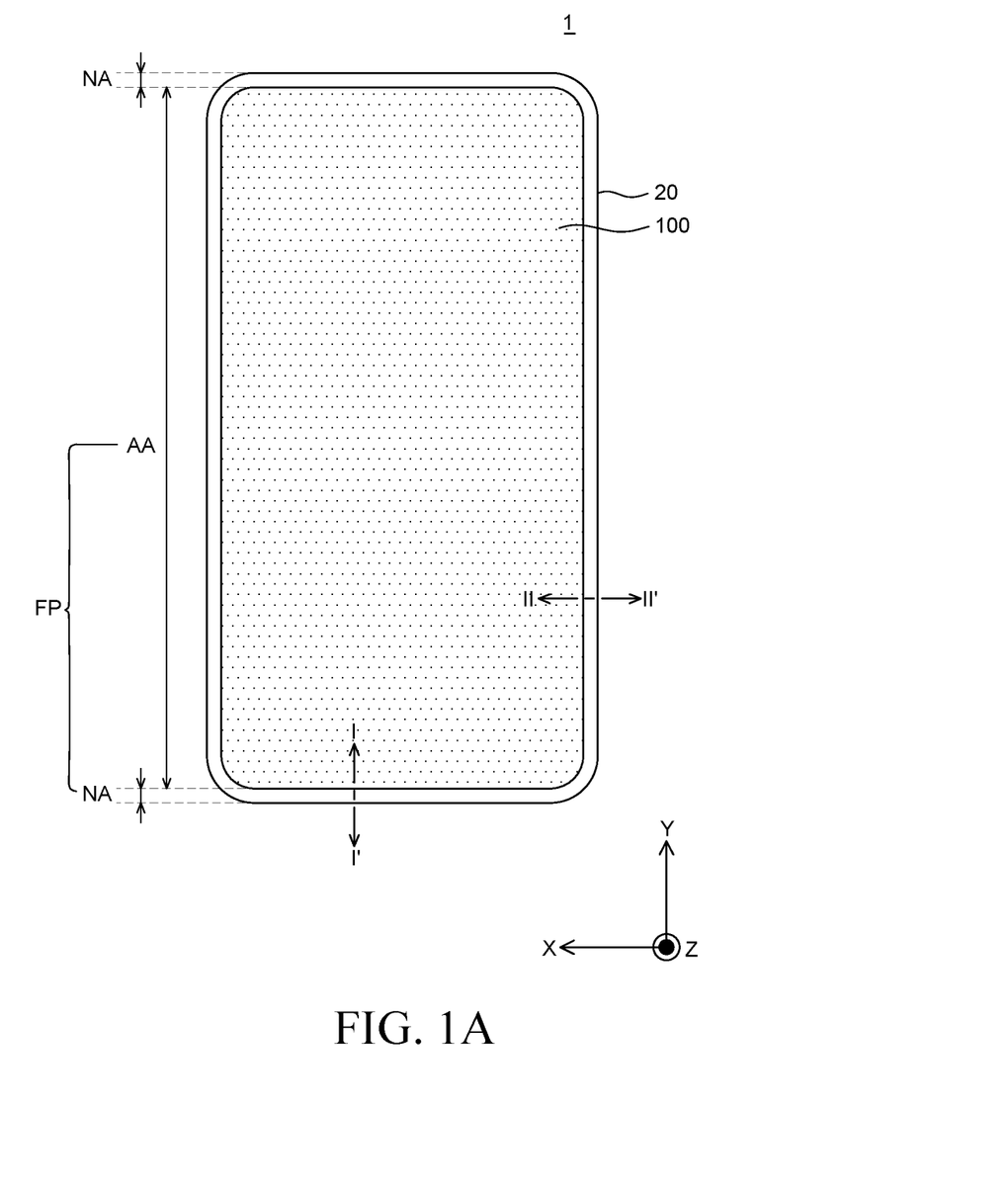
FIGS. 1A and 1C respectively illustrate a front view and a rear view of a display device according to an exemplary embodiment of the present disclosure.
Figure 1B:
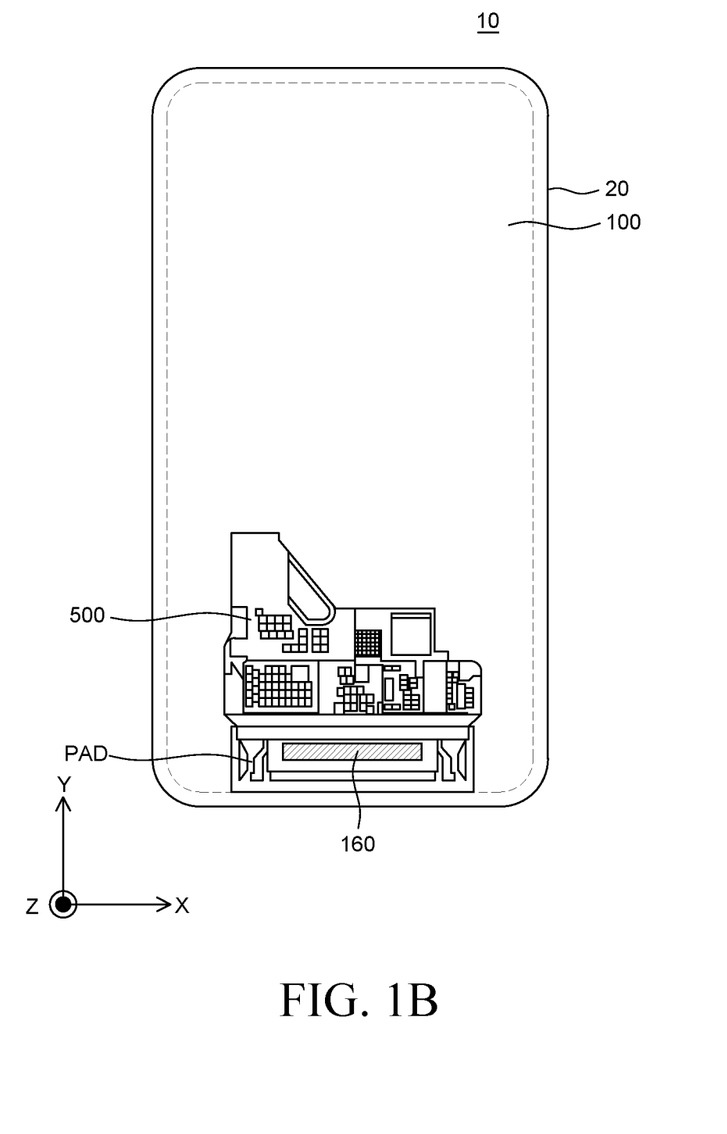
FIG. 1B illustrates a rear view of a display module from which a case part is removed according to an exemplary embodiment of the present disclosure.
Figure 1C:
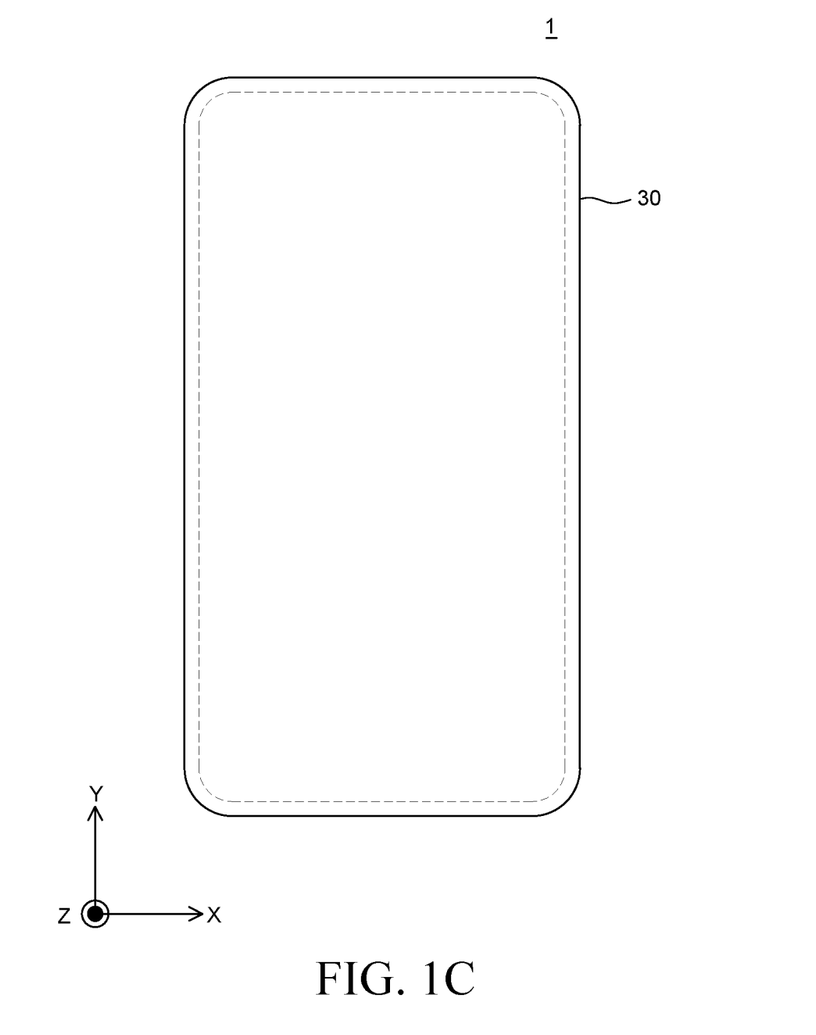

FIGS. 1A and 1C respectively illustrate a front view and a rear view of a display device according to an exemplary embodiment of the present disclosure, and FIG. 1B illustrates a rear view of a display module from which a case part is removed according to an exemplary embodiment of the present disclosure.

As defined herein, a front direction and an upward direction refer to a Z-axis direction, and a rear direction and a downward direction refer to a −Z-axis direction.

A display device 1 may include a display module 10 including a cover member 20 and a display panel 100 attached to a lower portion of the cover member 20 in the downward direction (−Z-axis).

The cover member 20 may be disposed to cover a front surface of the display device 1 and protect the display device 1 from external impact.

An edge portion of the cover member 20 may have a curvature portion or a curved portion bent in the rear direction of the display device 1.

Since the cover member 20 may be disposed to cover a side area of the display device 1 that is disposed in a rear thereof, it is possible to protect the display panel 100 from external impact not only on the front surface but also on a side surface of the display device 1.

The cover member 20 may overlap an active area AA where an image is displayed. For example, the cover member 20 may be formed of a transparent plastic material capable of transmitting an image, or a cover glass formed of a transparent glass material, but is not limited thereto.

A case part 30 supporting the cover member 20 may be disposed on a rear surface of the display module 10.

The case part 30 may serve as a housing that protects a rear surface of the display device 1, and may function as a case forming an outermost portion of the display device 1.

The case part 30 may be formed of various materials such as plastic, metal, or glass.

A middle frame part may be additionally disposed between the cover member 20 and the case part 30.

The middle frame part may be disposed on the rear surface of the display module 10 to accommodate the display module 10 and contact the cover member 20 to support the cover member 20.

The middle frame part may serve as a housing protecting the rear surface of the display module 10.

The display module 10 may be disposed on one surface of the middle frame part, and additional components such as batteries for applying power to drive the display device 1 may be disposed on the other surface of the middle frame part.

A front portion FP of the display panel 100 may be disposed below the cover member 20.

In the front portion FP, a pixel array unit including pixels having a plurality of light emitting elements and driving transistors, and signal lines for transmitting a driving signal to the pixels is disposed, so that an image may be displayed.

The front portion FP may include an active area AA in which an image is displayed and a non-active area NA that is an area other than the active area AA. The non-active area NA may be formed in an edge area surrounding the active area AA.

The active area AA and the non-active area NA may be applied to the cover member 20 in the same manner.

In the cover member 20, an area through which an image is transmitted may be the active area AA.

An area which surrounds the active area AA and through which an image is not transmitted may be the non-active area NA.

The non-active area NA may be defined as a bezel area.

The display panel 100 disposed below the cover member 20 may include a bending portion that extends from one side of the front portion FP and is bent downwardly.

The bending portion is positioned at an outermost portion of the display panel 100 and may be easily exposed to an external impact, and may be easily deformed or damaged when the impact is applied. Accordingly, it is possible to absorb the impact by adding a support member or a reinforcement member for protecting the bending portion.

Hereinafter, a structure of the display module 10 according to an exemplary embodiment of the present disclosure will be described.

Figure 2:
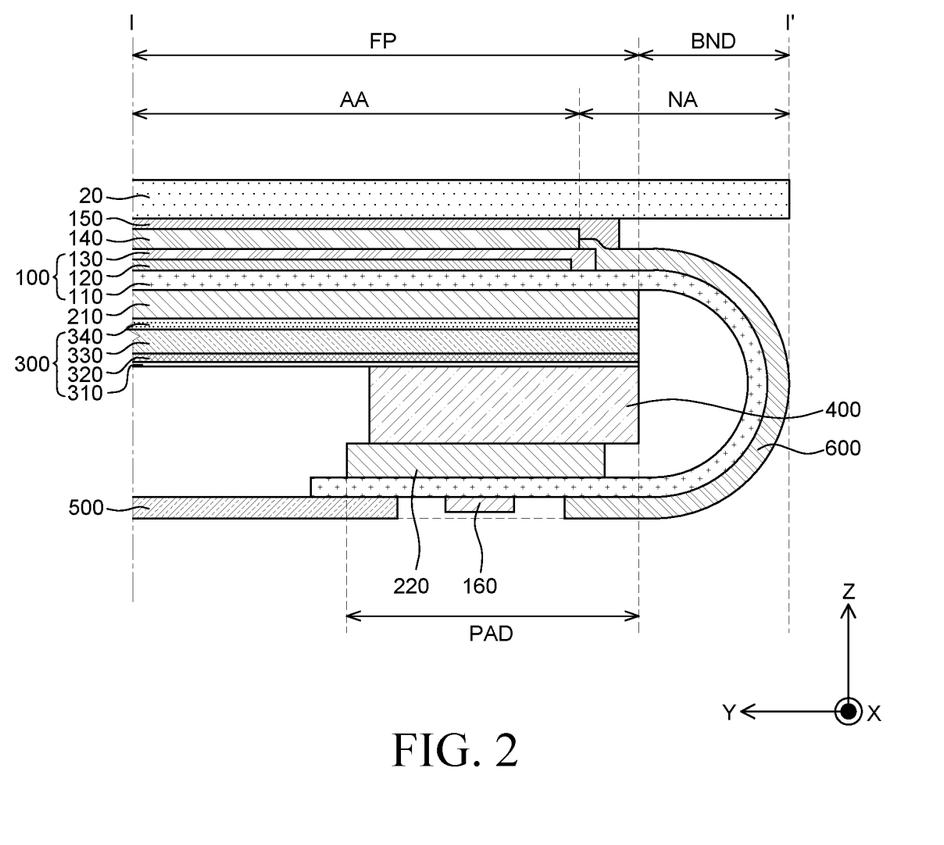
FIG. 2 is a cross-sectional view taken along line I-I' of the display module according to an exemplary embodiment of the present disclosure.

FIG. 2 is a cross-sectional view taken along line I-I' of the display module according to an exemplary embodiment of the present disclosure.

The display module 10 may include the cover member 20 that is positioned at a top portion thereof and the display panel 100 that is disposed below the cover member 20.

The display module 10 may include the display panel 100 including the front portion FP, a bending portion BND, and a pad portion PAD that extends from the bending portion BND and positioned on a rear surface of the front portion FP, a cushioning plate 300 between the front portion FP and the pad portion PAD, and a connection member 400 for connecting (e.g., attaching) the pad portion PAD to the cushioning plate 300.

A first back plate 210, the cushioning plate 300, the connection member 400, a second back plate 220, and the pad portion PAD may be sequentially disposed below the front portion FP of the display panel 100.

An adhesive layer 150 may be disposed between the cover member 20 and the display panel 100.

The adhesive layer 150 may connect or couple the cover member 20 and the display panel 100.

For example, the adhesive layer 150 may be a fixing member, and is not limited to the term.

Since the adhesive layer 150 may be disposed to overlap the active area AA, a material through which an image of the display panel 100 can be transmitted may be used therefor.

For example, the adhesive layer 150 is formed of, or may include a material such as optical clear adhesive (OCA), optical clear resin (OCR), pressure sensitive adhesive (PSA), or the like, but is not limited thereto.

The display panel 100 disposed below the cover member 20 may include the front portion FP, the bending portion BND, and the pad portion PAD based on the display substrate 110.

The front portion FP of the display panel 100 may be disposed under the adhesive layer 150. For example, the front portion FP may be a portion where an image is displayed, and may include a display substrate 110, a pixel array unit 120, an encapsulation unit 130, and a polarizing plate 140.

The bending portion BND of the display panel 100 may be a portion extending from one side of the front portion FP in the downward (−Z-axis) direction and bent in a plane (Y-axis) direction. The bending portion BND may include the display substrate 110 and signal lines.

The pad portion PAD of the display panel 100 may extend from the bending portion BND and may be disposed below the front portion FP such that the bending portion BND overlaps the front portion FP.

The pad portion PAD may include the display substrate 110, signal lines, and a pad electrode connected to the signal line.

A driving circuit unit 160 or a flexible printed circuit board 500 for driving the pixel may be mounted on the pad electrode.

The polarizing plate 140 may be disposed on an upper portion of the front portion FP of the display panel 100. In addition, a functional layer for improving display performance of the display device may be further disposed between the adhesive layer 150 and the polarizing plate 140.

The polarizing plate 140 may prevent or at least reduce reflection of external light and improve outdoor visibility and a contrast ratio of an image that is displayed on the display panel 100.

The display panel 100 may include the display substrate 110, the pixel array unit 120 disposed on the display substrate 110, and the encapsulation unit 130 disposed to cover the pixel array unit 120.

The display substrate 110 may be disposed at a bottom portion of the display panel 100.

The display substrate 110 may be formed on all of the front portion FP, the bending portion BND, and the pad portion PAD.

The display substrate 110 may be formed of a plastic material having flexibility and thus, have flexible characteristics.

The display substrate 110 may include polyimide, and may be formed of a flexible, thin glass material.

The pixel array unit 120 may be disposed on the display substrate 110. The pixel array unit 120 may display an image. A portion in which the pixel array unit 120 is disposed may be the active area AA.

Accordingly, an area corresponding to the pixel array unit 120 based on the cover member 20 may be the active area AA, and an area other than the active area AA may be the non-active area NA.

The pixel array unit 120 may include light emitting elements, thin film transistors for driving the light emitting elements, and signal lines such as a gate line, a data line, and a pixel driving power line on the display substrate 110.

The pixel array unit 120 may include pixels that display an image according to signals that are supplied to the signal lines, and the pixel may include the light emitting element and the thin film transistor.

The light emitting element may include an anode electrode that is electrically connected to the thin film transistor, a light emitting layer that is formed on the anode electrode, and a cathode electrode that supplies a common voltage.

The thin film transistor may include a gate electrode, a semiconductor layer, a source electrode, a drain electrode, and the like.

The semiconductor layer of the thin film transistor may include silicon such as a-Si, poly-Si, or low-temperature poly-Si, or an oxide such as indium-gallium-zinc-oxide (IGZO), but is not limited thereto.

The anode electrode may be disposed to correspond to an opening area that is provided according to a pattern shape of the pixel and be electrically connected to the thin film transistor in each pixel area.

The light emitting element may include a light emitting layer formed between the anode electrode and the cathode electrode.

The light emitting layer may be implemented to emit light of the same color in respective pixels, such as white light, or may be implemented to emit light of different colors in the respective pixels, such as red light, green light, and blue light.

The encapsulation unit 130 may be disposed on the display substrate 110 to cover the pixel array unit 120.

The encapsulation unit 130 may prevent or at least reduce oxygen, moisture, or foreign materials from penetrating into the light emitting layer of the pixel array unit 120.

The encapsulation unit 130 may be formed in a multilayer structure in which an organic material layer and an inorganic material layer are alternately stacked, but is not limited thereto.

The front portion FP of the display panel 100 may include the display substrate 110, the pixel array unit 120, and the encapsulation unit 130, and may be formed in a planar state in an area other an edge portion thereof.

The first back plate 210, which will be described later, may be connected to or coupled to a lower portion of the front portion FP so as to maintain the planar state.

In the bending portion BND of the display panel 100, the pixel array unit 120, the encapsulation unit 130, and the first back plate 210 to be described later are not disposed and the display substrate 110 may be disposed. The bending portion BND of the display panel 100 may be a portion that can be easily bent in a direction desired by a user.

The pad portion PAD of the display panel 100 may be a portion where the pixel array unit 120 and the encapsulation unit 130 are not disposed.

The second back plate 220, which will be described later, may be connected to or coupled to a lower portion of the pad portion PAD so that the pad portion PAD may maintain a planar state.

Accordingly, the front portion FP of the display panel 100 is disposed in a direction in which a screen is displayed, and the pad portion PAD of the display panel 100 is bent from the bending portion BND in a downward direction of the front portion FP and may be positioned in the downward direction of the front portion FP, that is, on the rear surface of the front portion FP.

The first back plate 210 that is disposed on a lower portion of the front portion FP of the display panel 100 and the second back plate 220 that is disposed in a lower portion of the pad portion PAD are disposed below the display substrate 110 and may maintain the front portion FP in a planar state while supplementing rigidity of the display substrate 110.

The first back plate 210 and the second back plate 220 may be formed to have a constant strength and thickness in order to supplement rigidity of the display substrate 110, and may not be formed in an area of the bending portion BND in which the bending portion BND is positioned.

Based on a shape before the display panel 100 is bent, the first back plate 210 and the second back plate 220 may be disposed below the display substrate 110 and may be disposed to be spaced apart from each other.

Based on a shape after the display panel 100 is bent, the first back plate 210 may be disposed below the front portion FP, and the second back plate 220 may be disposed above the pad portion PAD.

The first back plate 210 and the second back plate 220 may be back plates that are disposed on a rear surface of the display substrate 110.

The first back plate 210 and the second back plate 220 may be formed of a rigid plastic thin film.

For example, the first back plate 210 and the second back plate 220 may be formed of polyethylene terephthalate (PET), polyimide (PI), polyethylene naphthalate (PEN) or the like, but are not limited thereto.

The first back plate 210 and the second back plate 220 may be formed of the same material and have the same thickness, but are not limited thereto.

Based on the shape after the display panel 100 is bent, the cushioning plate 300 may be disposed between the first back plate 210 and the second back plate 220.

The cushioning plate 300 may be disposed under the first back plate 210.

The cushioning plate 300 may include one or more of a heat dissipation layer 310, a lifting prevention layer 320, a cushioning layer 330, and an embossed layer 340. For example, the cushioning plate 300 may have a form in which the embossed layer 340, the cushioning layer 330, the lifting prevention layer 320 (e.g., a lifting reduction layer), and the heat dissipation layer 310 are sequentially stacked from above. As show in FIG. 3, an end portion of the cushioning plate 300 (310, 330, 340) does not extend past the end portion of the display panel 100.

The heat dissipation layer 310 may be disposed to correspond to a component generating a high temperature, and may include a material having high thermal conductivity. Accordingly, a heat dissipation effect of the display panel 100 may be improved.

The heat dissipation layer 310 may be a conductive layer having conductivity. Accordingly, the heat dissipation layer 310 may have a function of dissipating heat as well as a grounding function and a function of protecting the rear surface of the display substrate 110.

When the heat dissipation layer 310 is formed of a metal layer, an end portion area of the display panel 100 that is vulnerable to cracks may be effectively protected.

For example, the heat dissipation layer 310 may include a metal having high thermal conductivity such as copper (Cu) and aluminum (Al), or graphite or the like, but is not limited thereto.

In addition, the heat dissipation layer 310 may include stainless use steel (SUS), and may be a SUS plate.

When the heat dissipation layer 310 includes the SUS, it may have a higher thermal conductivity and strength while having a thinner thickness compared to other metals.

The heat dissipation layer 310 may have a thickness of at least 30 μm or more in order to have an effective heat dissipation effect.

The lifting prevention layer 320 may be disposed on the heat dissipation layer 310.

The lifting prevention layer 320 may be formed of a flexible material such as a polyimide film, but is not limited thereto.

When a side surface of the cover member 20 is bent, since a lifting phenomenon of the cushioning plate 300 may occur, the lifting prevention layer 320 may be disposed to prevent or at least reduce the lifting phenomenon.

Since the lifting prevention layer 320 has flexibility, it is possible to reduce the lifting phenomenon that may occur when the curvature portion is formed on the cover member 20.

The cushioning layer 330 is disposed on the lifting prevention layer 320 and may include a foam tape or a foam pad.

The cushioning layer 330 may alleviate impacts of various components that may come into contact with the cushioning plate 300.

The cushioning layer 330 having an impact alleviating function may reinforce rigidity of the cushioning plate 300.

The embossed layer 340 may be disposed on the cushioning layer 330, and may be an adhesive layer having an embossed pattern on a surface of the embossed layer 340.

The embossed pattern of the embossed layer 340 may include, for example, an uneven structure formed on a surface thereof.

The uneven structure of the embossed layer 340 can prevent air bubbles from being generated between the first back plate 210 and the cushioning plate 300 when the cushioning plate 300 is attached to the first back plate 210. Therefore, a defoaming process for removing air bubbles between the first back plate 210 and the cushioning plate 300 may be omitted.

The embossed layer 340 includes an adhesive component, and may be in direct contact with the first back plate 210 to fix the cushioning plate 300 to the first back plate 210.

The embossed layer 340 may be formed of, or include a material such as optical clear adhesive (OCA), optical clear resin (OCR) or pressure sensitive adhesive (PSA).

The embossed layer 340 may have a thickness of at least 40 μm or more for an adhesion function and air bubble prevention.

The connection member 400 and the second back plate 220 may be disposed under the cushioning plate 300.

The connection member 400 may be disposed between the cushioning plate 300 and the pad portion PAD.

When the pad portion PAD of the display panel 100 is bent in the bending portion BND so that it is disposed below the front portion FP of the display panel 100, restoring force that tries to restore a state before bending may strongly act on the display panel 100.

When the restoring force strongly acts, a lifting phenomenon in which the bent pad portion PAD of the display panel 100 is not fixed but lifting may occur.

The connection member 400 may function as a fixing member for fixing the bent display panel 100 to maintain a bent shape thereof.

The connection member 400 may be formed to have a constant thickness in a thickness direction so as to maintain a constant curvature of the bending portion BND. That is, the connection member has a constant thickness such that a constant curvature of the bending portion is maintained.

The connection member 400 may be a double-sided tape having an adhesive force capable of fixing the second back plate 220 and the heat dissipation layer 310, but is not limited thereto.

Alternatively, the connection member 400 may be formed of a foam tape or a foam pad having an adhesive force and thus, further have an effect of alleviating an impact.

The second back plate 220 may be disposed under the connection member 400.

To dispose the second back plate 220, the second back plate 220 may be first attached to a lower surface of the pad portion PAD, the bending portion BND may be bent, and the second back plate 220 may be attached and fixed to a lower surface of the connection member 400.

In a state in which the second back plate 220 is fixed to the connection member 400, the second back plate 220 may have a structure in which it is disposed on the pad portion PAD.

For example, the connection member 400 and the second back plate 220 may be disposed between the heat dissipation layer 310 of the cushioning plate 300 and the pad portion PAD.

In a state in which the second back plate 220 is fixed to the connection member 400, an outer portion that is an upper surface of the bending portion BND, is exposed to the outside, and a lower surface that is an inner portion of the bending portion BND may be disposed toward the cushioning plate 300 and the connection member 400.

A reinforcement member 600 may be disposed on the upper surface that is the outer portion of the bending portion BND of the display panel 100.

The reinforcement member 600 may cover the bending portion BND and may extend to cover at least a partial area of the front portion FP and the pad portion PAD. That is, the reinforcement member 600 extends from at least a portion of the front portion FP to at least a portion of the pad portion PAD through the bending portion BND.

The reinforcement member 600 may include resin. For example, the reinforcement member 600 may include an ultraviolet (UV) curable acrylic resin, but is not limited thereto.

Since the reinforcement member 600 may cover various signal lines disposed between the encapsulation unit 130 and the pad portion PAD of the display panel 100, it is possible to prevent or at least reduce penetration of moisture into the signal lines while protecting the signal lines from external impact.

Since other components except for the display substrate 110 and signal lines may be eliminated from the bending portion BND to increase flexibility of the display panel 100, the reinforcement member 600 may supplement rigidity of the bending portion BND from which other components are eliminated Meanwhile, the driving circuit unit 160 may be disposed on the other surface of the pad portion PAD of the display panel 100 that has one surface on which the second back plate 220 is disposed.

The driving circuit unit 160 may be disposed in a form of a chip on plastic (COP) that is mounted on the display substrate 110, but is not limited thereto.

The driving circuit unit 160 may generate a data signal and a gate control signal based on a timing synchronization signal and image data supplied from an external host driving system.

The driving circuit unit 160 may supply the data signal to the data line of each pixel through a display pad portion, and may supply the gate control signal to a gate driving circuit unit.

The driving circuit unit 160 is mounted in a chip mounting area that is defined in the display substrate 110 and is electrically connected to the display pad portion, and may be connected to each of the signal lines of the pixel array unit 120 and the gate driving circuit unit disposed on the display substrate 110.

The display pad portion may be disposed at an end portion of the display substrate 110 on which the driving circuit unit 160 is mounted.

The display pad portion may be electrically connected to the flexible printed circuit board 500 on which a circuit board is mounted at one surface of the display substrate 110.

The flexible printed circuit board 500 may be electrically connected to the display pad portion provided at the end portion of the display substrate 110 by a film attachment process using a conductive adhesive layer as a medium, and may be positioned on a rear surface of the display panel 100.

As the conductive adhesive layer, a conductive film such as anisotropic conductive film (ACF) may be used as an example.

The circuit board may provide the timing synchronization signal and image data supplied from the host driving system to the driving circuit unit 160 and provide voltages that are required for driving each of the pixel array unit 120, the gate driving circuit unit, and the driving circuit unit 160.

Figure 3:
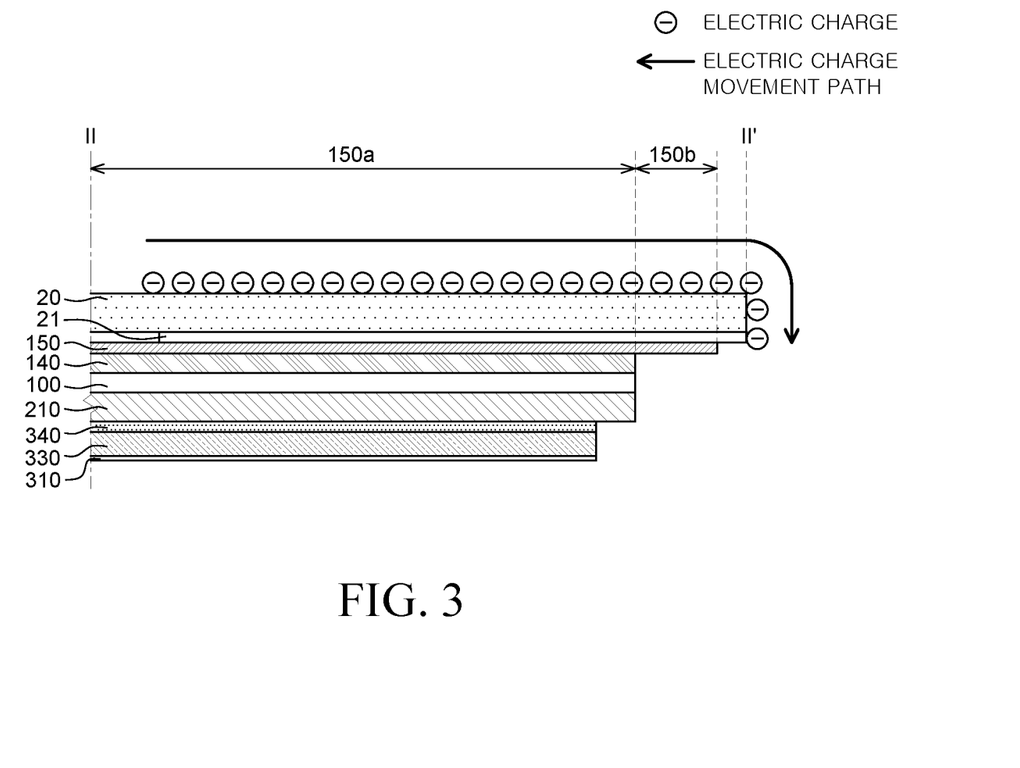
FIG. 3 is a cross-sectional view taken along line II-II' of the display module according to an exemplary embodiment of the present disclosure.

FIG. 3 illustrates a cross-section taken along line II-II' of the display module according to an exemplary embodiment of the present disclosure as an example, but this may also be applied to a cross-section of a left edge thereof and a cross-section of an upper edge thereof.

Respective layers constituting the display module shown in FIG. 3 may be shown to be different from the respective layers constituting the display module shown in FIG. 2 in terms of thicknesses or sizes for convenience of explanation, and descriptions may be made with omission of some of the layers.

The display module 10 according to an exemplary embodiment of the present disclosure may include the cover member 20, the display panel 100 disposed on one surface of the cover member 20, and the cushioning plate 300 disposed on one surface of the display panel 100.

The adhesive layer 150 may be included to be disposed between the cover member 20 and the display panel 100. An end portion of the adhesive layer 150 may be disposed more outwardly toward an end portion of the cover member than an end portion of the display panel 100. That is, the end portion (e.g., an end) of the adhesive layer 150 extends past the end portion of the display panel 100. Thus, the end portion of the adhesive layer 150 is closer to an end portion (e.g., an end) of the cover member 20 than the end of the display panel 100 such that a distance between the end portion of the adhesive layer 150 and the end portion of the cover member 20 is less than a distance between the end portion of the display panel 100 and the end portion of the cover member 20. Thus, since the adhesive layer 150 serves to bond the cover member 20 and the display panel 100, the adhesive layer 150 may be disposed so that the adhesive layer 150 does not protrude past an end portion of the cover member 20 in the horizontal direction (e.g., x-direction). For example, the end portion of the adhesive layer 150 may be positioned between the end portion of the display panel 100 and the end portion of the cover member 20 in the horizontal direction. For example, an area of the display panel 100 may be smaller than an area of the adhesive layer 150. An upper surface and a lower surface of the display panel 100 each have an area smaller than an area of each of an upper surface and a lower surface of the adhesive layer 150.

As shown in FIG. 2, since the adhesive layer 150 may be disposed to overlap the active area AA, a material through which an image of the display panel 100 can be transmitted may be used therefor. For example, the adhesive layer 150 is formed of, or may include, a material such as optical clear adhesive (OCA), optical clear resin (OCR), pressure sensitive adhesive (PSA), or the like, but is not limited thereto.

As described above, by extending the end portion of the adhesive layer 150 to protrude past the end portion of the display panel 100, movements of electric charges formed in the cover member 20 may be prevented due to the adhesive layer 150 formed of an insulating material. Since the adhesive layer 150 includes an insulating material, the adhesive layer 150 may be considered an insulation layer. Accordingly, it is possible to reduce movements of electric charges to an inside of the display panel 100, so that a brightness phenomenon and a greenish phenomenon that may intensively occur in a partial area of a side surface of the display panel 100 may be prevented.

The polarizing plate 140 may be included on an upper portion of the display panel 100. The polarizing plate 140 may prevent or at least reduce reflection of external light and improve outdoor visibility and a contrast ratio of an image displayed on the display panel 100. The polarizing plate 140 may be a polarizing plate composed of a polarizer and a protective film protecting the polarizer, or may be formed by coating a polarizing material for flexibility. A rear surface of the adhesive layer 150 may include a first area 150a that is in contact with the polarizing plate 140 and a second area 150b that is not in contact with the polarizing plate 140.

The first back plate 210 may be disposed under the display substrate 110 and maintain the display substrate 110 in a flat state while supplementing rigidity of the display substrate 110.

The cushioning plate 300 may be disposed under the first back plate 210. The cushioning plate 300 may include the heat dissipation layer 310, the cushioning layer 330, and the embossed layer 340. For example, the cushioning plate 300 may have a form in which the embossed layer 340, the cushioning layer 330, and the heat dissipation layer 310 are sequentially stacked from above.

The heat dissipation layer 310 may be disposed to correspond to a component generating a high temperature, and may include a material having high thermal conductivity. Accordingly, a heat dissipation effect of the display panel 100 may be improved.

The heat dissipation layer 310 may be a conductive layer having conductivity. Accordingly, the heat dissipation layer 310 may have a function of dissipating heat as well as a grounding function and a function of protecting the rear surface of the display substrate 110.

When the heat dissipation layer 310 is formed of a metal layer, an end portion area of the display panel 100 that is vulnerable to cracks may be effectively protected.

For example, the heat dissipation layer 310 may include a metal having high thermal conductivity such as copper (Cu) and aluminum (Al), or graphite or the like, but is not limited thereto.

In addition, the heat dissipation layer 310 may include stainless use steel (SUS), and may be a SUS plate.

When the heat dissipation layer 310 includes the SUS, it may have a higher thermal conductivity and strength while having a thinner thickness compared to other metals.

The heat dissipation layer 310 may have a thickness of at least 30 μm or more in order to have an effective heat dissipation effect.

The cushioning layer 330 is disposed on the heat dissipation layer 310 and may include a foam tape or a foam pad.

The cushioning layer 330 may alleviate impacts of various components that may come into contact with the cushioning plate 300.

The cushioning layer 330 having an impact alleviating function may reinforce rigidity of the cushioning plate 300.

The embossed layer 340 may be disposed on the cushioning layer 330, and may be an adhesive layer having an embossed pattern on the surface of the embossed layer 340.

The embossed pattern of the embossed layer 340 may include, for example, an uneven structure formed on the surface thereof.

The uneven structure of the embossed layer 340 can prevent air bubbles from being generated between the first back plate 210 and the cushioning plate 300 when the cushioning plate 300 is attached to the first back plate 210. Therefore, a defoaming process for removing air bubbles between the first back plate 210 and the cushioning plate 300 may be omitted.

The embossed layer 340 includes an adhesive component, and may be in direct contact with the first back plate 210 to fix the cushioning plate 300 to the first back plate 210.

The embossed layer 340 may be formed of, or include a material such as optical clear adhesive (OCA), optical clear resin (OCR) or pressure sensitive adhesive (PSA).

The embossed layer 340 may have a thickness of at least 40 μm or more for an adhesion function and air bubble prevention.

An end portion of the cushioning plate 300 may be positioned more inwardly from an end portion of the cover member 20 than the end portion of the display panel 100. That is, the cover member 20 may be positioned most outwardly, and the adhesive layer 150 may be positioned more inwardly than the cover member 20. The display panel 100 may be positioned more inwardly than adhesive layer 150, and the cushioning plate 300 may be positioned more inwardly than the display panel 100. For example, the cover member 20, the adhesive layer 150, the display panel 100, and the cushioning plate 300 may be stacked in a stepped shape.

A light blocking pattern 21 may be formed on four surfaces of an edge of the cover member 20. That is, the light blocking pattern 21 may be formed on a rear surface of the edge of the cover member 20. Also, the light blocking pattern 21 may be formed to overlap a portion of the adhesive layer 150, the polarizing plate 140, and the display panel 100 that are disposed therebelow. In addition, the light blocking pattern 21 may be formed to overlap a portion of the cushioning plate 300 therebelow.

Meanwhile, the light blocking pattern 21 may be formed of a material having low transmittance in order to define an edge of the active area. At the same time, the light blocking pattern 21 may be formed of a material having high electrical conductivity in order to discharge static electricity generated from the cover member 20.

For example, the light blocking pattern 21 may be formed of chromium (Cr) or graphite, or may be formed of resin including conductive particles. The resin described above may be formed of one or more materials among acrylic resin, epoxy resin, phenolic resin, polyamides resin, polyimides resin, unsaturated polyesters resin, polyphenylene resin, polyphenylenesulfides resin, and benzocyclobutene, but is not limited thereto. In addition, the conductive particles may also be formed of molybdenum (Mo), chromium (Cr), titanium (Ti), nickel (Ni), neodymium (Nd), copper (Cu), and an alloy of silver (Ag) and magnesium (Mg), but are not limited thereto.

Although not shown, a touch screen panel may be further provided on the display panel 100. In this case, the polarizing plate 140 may be positioned above the touch screen panel. When the touch screen panel is included, the cover member 20 may be provided to cover at least a portion of the touch screen panel.

The touch screen panel includes a plurality of touch sensors. The touch sensor may be disposed at a position corresponding to the active area AA of the display panel 100. The touch sensor may include at least one of a mutual capacitance sensor and a self-capacitance sensor.

The mutual capacitance sensor includes a mutual capacitance formed between two touch electrodes. A mutual capacitance sensing circuit may apply a driving signal (or a stimulus signal) to any one of the two electrodes and sense a touch input based on a variance in electric charge of mutual capacitance through the other electrode. When a conductor approaches the mutual capacitance, the amount of electric charge in the mutual capacitance is reduced, so that the touch input or gesture can be detected.

The self-capacitance sensor includes a self-capacitance formed in each of sensor electrodes. A self-capacitance sensing circuit can supply an electric charge to each sensor electrode and sense a touch input based on variance of electric charges in the self-capacitance. When a conductor approaches the self-capacitance, capacitance of the conductor is connected in parallel to capacitance of the sensor, thereby increasing a capacitance value. Therefore, in the case of a self-capacitance, when a touch input is sensed, the capacitance value of the sensor increases.

Figure 4:
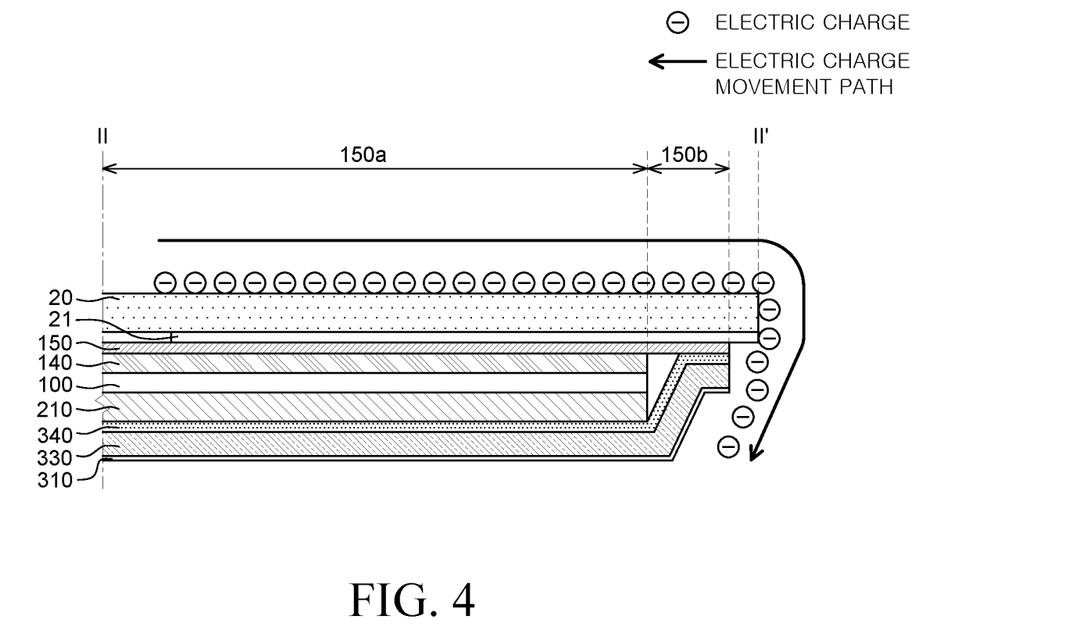
FIG. 4 is a cross-sectional view taken along line II-II' of a display module according to another exemplary embodiment of the present disclosure.

FIG. 4 is a cross-sectional view taken along line II-IP of a display module according to another exemplary embodiment of the present disclosure.

Referring to FIG. 4, the display module 10 may include the cover member 20, the display panel 100 disposed on one surface of the cover member 20, and the cushioning plate 300 disposed on one surface of the display panel 100.

The adhesive layer 150 may be included to be disposed between the cover member 20 and the display panel 100. The end portion of the adhesive layer 150 may be disposed more outwardly than the end portion of the display panel 100. That is, the end portion of the adhesive layer 150 extends past the end portion of the display panel 100. Thus, since the adhesive layer 150 serves to bond the cover member 20 and the display panel 100, the adhesive layer 150 may be disposed so that the adhesive layer 150 does not protrude past the end portion of the cover member 20. For example, the end portion of the adhesive layer 150 may be positioned between the end portion of the display panel 100 and the end portion of the cover member 20 in the horizontal direction.

As shown in FIG. 2, since the adhesive layer 150 may be disposed to overlap the active area AA, a material through which an image of the display panel 100 can be transmitted may be used therefor. For example, the adhesive layer 150 is formed of, or may include, a material such as optical clear adhesive (OCA), optical clear resin (OCR), pressure sensitive adhesive (PSA), or the like, but is not limited thereto.

The polarizing plate 140 may be included on the upper portion of the display panel 100. The polarizing plate 140 may prevent or at least reduce reflection of external light and improve outdoor visibility and a contrast ratio of an image displayed on the display panel 100. The polarizing plate 140 may be a polarizing plate composed of a polarizer and a protective film protecting the polarizer, or may be formed by coating a polarizing material for flexibility. The rear surface of the adhesive layer 150 may include the first area 150a that is in contact with the polarizing plate 140 and the second area 150b that is not in contact with the polarizing plate 140.

The first back plate 210 may be disposed under the display substrate 110 and maintain the display substrate 110 in a flat state while supplementing rigidity of the display substrate 110.

The cushioning plate 300 may be disposed under the first back plate 210. The cushioning plate 300 may include the heat dissipation layer 310, the cushioning layer 330, and the embossed layer 340. For example, the cushioning plate 300 may have a form in which the embossed layer 340, the cushioning layer 330, and the heat dissipation layer 310 are sequentially stacked from above.

The cushioning plate 300 may contact the first back plate 210 and the second area 150b of the adhesive layer 150. That is, the end portion of the cushioning plate 300 positioned under the first back plate 210 may extend outwardly so that the rear surface of the end portion of the adhesive layer 150 that extends past the end portion of the display panel 100 and an upper surface of the end portion of the cushioning plate 300 may be disposed to contact each other. For example, the end portion of the cushioning plate 300 may be disposed to coincide with the end portion of the adhesive layer 150. The end portion of the cushioning plate 300 may be positioned between the end portion of the cover member 20 and an end portion of the polarizing plate 140 in the horizontal direction.

As the end portion of the cushioning plate 300 and the end portion of the adhesive layer 150 are disposed to coincide (e.g., align) with each other, electric charges formed in the cover member 20 do not move to the display panel and may be guided to move to a rear surface of the cushioning plate 300 along side surfaces of the adhesive layer 150 and the cushioning plate 300.

The cushioning plate 300 may have a form in which the embossed layer 340, the cushioning layer 330, and the heat dissipation layer 310 are sequentially stacked from above. Since the heat dissipation layer 310 is formed of a conductive layer having conductivity, electric charges of the cover member 20 may be guided to the heat dissipation layer 310 and be effectively discharged to the outside. Accordingly, it is possible to reduce movements of electric charges to the inside of the display panel 100, so that a brightness phenomenon and a greenish phenomenon that may intensively occur in a partial area of the side surface of the display panel 100 may be prevented.

Due to thicknesses of the display panel 100 and the first back plate 210, the side surface of the display panel 100 may be spaced apart from the cushioning plate 300 by a predetermined distance in the horizontal direction. Alternatively, the side surface of the display panel 100 may contact the embossed layer 340 according to a thickness and viscosity of the embossed layer 340 positioned on an upper portion of the cushioning plate 300. Even in this case, electric charges formed in the cover member 20 may be guided to the heat dissipation layer 310 without moving to the display panel.

The display device according to an exemplary embodiment of the present disclosure may include the display module according to an exemplary embodiment of the present disclosure and a case part disposed on the rear surface of the display module to support the cover member.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display module comprising:
    a cover member including an end portion;
    a display panel on a surface of the cover member;
    a cushioning plate on a surface of the display panel; and
    an adhesive layer between the cover member and the display panel,
    in a cross-section, an end portion of the adhesive layer is positioned so as to protrude outward than an end portion of the display panel.

2. The display module of claim 1, wherein the end portion of the adhesive layer is between the end portion of the display panel and the end portion of the cover member in a horizontal direction.

3. The display module of claim 2, further comprising:
    a polarizing plate on an upper portion of the display panel,
    wherein a rear surface of the adhesive layer includes a first area that is in contact with the polarizing plate and a second area that is not in contact with the polarizing plate.

4. The display module of claim 3, wherein the cushioning plate includes an embossed layer, a cushioning layer on the embossed layer, and a heat dissipation layer on the cushioning layer.

5. The display module of claim 4, wherein the cushioning plate further comprises a lifting reduction layer between the heat dissipation layer and the cushioning layer.

6. The display module of claim 4, wherein the embossed layer is an adhesive layer having an embossed pattern on a surface of the embossed layer.

7. The display module of claim 4, further comprising:
    a first back plate between the display panel and the cushioning plate.

8. The display module of claim 7, wherein an end portion of the cushioning plate is positioned more inwardly away from the end portion of cover member than the end portion of the display panel.

9. The display module of claim 7, wherein the cushioning plate is in contact with the first back plate and the second area of the adhesive layer but is not in contact with the first area of the adhesive layer.

10. The display module of claim 7, wherein the display panel includes a front portion, a bending portion, and a pad portion that extends from the bending portion, the pad portion on a rear surface of the front portion.

11. The display module of claim 10, further comprising:
    a connection member below the cushioning plate such that the cushioning plate is between the connection member and the first back plate; and
    a second back plate below the connection member.

12. The display module of claim 10, further comprising:
    a reinforcement member on the bending portion, the reinforcement member extending from at least a portion of the front portion to at least a portion of the pad portion through the bending portion.

13. The display module of claim 11, wherein the connection member and the second back plate are between the heat dissipation layer and the pad portion.

14. The display module of claim 11, wherein the connection member has a constant thickness such that a constant curvature of the bending portion is maintained.

15. The display module of claim 9, wherein an end portion of the cushioning plate is positioned between the end portion of the cover member and an end portion of the polarizing plate in a horizontal direction.

16. The display module of claim 15, wherein the end portion of the cushioning plate is aligned with the end portion of the adhesive layer.

17. The display module of claim 15, wherein a side surface of the display panel is spaced apart from the cushioning plate by a predetermined distance in the horizontal direction.

18. The display module of claim 15, wherein the adhesive layer includes at least one of optical clear adhesive, optical clear resin, or pressure sensitive adhesive (PSA).

19. The display module of claim 18, further comprising:
a light blocking pattern on a rear surface of an edge of the cover member.

20. The display module of claim 1, wherein an upper surface of the display panel and a lower surface of the display panel each have an area that is less than an area of each of an upper surface of the adhesive layer and a lower surface of the adhesive layer.

21. The display module of claim 1, wherein an end portion of the cushioning plate is positioned more inwardly from the end portion of the cover member than the end portion of the display panel.

22. A display device comprising:
the display module of claim 1; and
a case part on a rear surface of the display module, the case part supporting the cover member.

23. A display module comprising:
a display panel having a first side and a second side opposite the second side;
a cover member on the first side of the display panel; and
an adhesive layer on the first side of the display panel, the adhesive layer between the cover member and the display panel,
in a cross-section, an end of the adhesive layer is positioned so as to protrude outward than an end of the display panel,
wherein a distance between an end of the adhesive layer and an end of the cover member is less than a distance between an end of the display panel and the end of the cover member.

24. The display module of claim 23, further comprising:
a cushioning plate on the second side of the display panel, wherein an end of the cushioning plate does not extend past the end of the display panel.

25. The display module of claim 23, further comprising:
a cushioning plate on the second side of the display panel, wherein an end of the cushioning plate is in contact with a portion of the end of the adhesive layer.

* * * * *